United States Patent [19] Stiles, Jr.

[11] 3,768,050

[45] Oct. 23, 1973

[54] MICROWAVE INTEGRATED CIRCUIT

[75] Inventor: Charles Wesley Stiles, Jr., Scottsdale, Ariz.

[73] Assignee: Motorola, Inc., Franklin Park, Ill.

[22] Filed: May 19, 1971

[21] Appl. No.: 144,746

[52] U.S. Cl. ................ 333/97 S, 333/35, 333/84 M
[51] Int. Cl. ........ H01p 3/08, H01p 5/12, H01p 1/10
[58] Field of Search ...................... 333/7, 84 M, 35, 333/97 S; 317/101 A; 334/15; 330/53; 331/107 T, 108 R, 108 C, 96, 101

[56] References Cited

UNITED STATES PATENTS

| | | | |
|---|---|---|---|
| 3,417,351 | 12/1968 | Di Piazza | 333/73 |
| 3,223,947 | 12/1965 | Clar | 333/7 |
| 3,454,906 | 7/1969 | Hyltin et al. | 317/101 A X |
| 3,462,709 | 8/1969 | Mitchell, Jr. | 331/101 T X |
| 3,503,015 | 3/1970 | Coraccio et al. | 333/7 |
| 3,530,411 | 9/1970 | Sear | 333/84 M X |
| 3,546,636 | 12/1970 | Di Piazza | 307/317 X |
| 3,593,205 | 7/1971 | Coraccio et al. | 333/7 |

OTHER PUBLICATIONS

Horton, "A Thin Film X-Band Varactor Quadrupler" in IEEE Transactions on Microwave Theory and Techniques Dec. 1967 MTT5; pp. 752–754.

Welch, "Beam Lead Tunnel Diode Amplifiers on Microstrip" in IEE Transactions on Microwave Theory and Techniques Dec. 1970 MTT 18; pp. 1077–1083.

"Mounting a Semiconductor Chip" (Cozens et al.) IBM Technical Disclosure Bulletin Vol. 10, No. 7 Dec. 1967; p. 1050.

*Primary Examiner*—Rudolph V. Rolinec
*Assistant Examiner*—Marvin Nussbaum
*Attorney*—Mueller & Aichele

[57] ABSTRACT

A hybrid microwave integrated circuit mounting and tuning technique is disclosed whereby electrically shunt mounted unpackaged diode chips, or other semiconductor chips, may be mounted on top of the substrate on which the microstrip transmission line is formed and the components for eliminating, by resonance, the capacitances and parasitic inductances of the semiconductor chips and leads, and supplying any desired DC bias, likewise, are mounted on top of the substrate.

14 Claims, 6 Drawing Figures

INVENTOR
Charles Wesley Stiles Jr.
BY Mueller & Aichele
ATTY'S.

INVENTOR
Chales Wesley Stiles Jr.
BY
Mueller & Aichele
ATTY'S.

MICROWAVE INTEGRATED CIRCUIT

BACKGROUND OF THE INVENTION

This invention relates to microwave integrated circuit mounting and tuning techniques for unpackaged diode chips, and more particularly to such microwave integrated circuits utilizing microstrip transmission lines and it is an object of the invention to provide improved apparatus and/or methods of this nature.

Hybrid microwave integrated circuits are known wherein a metallic ground plane is bonded at one side to an insulating substrate and the microwave integrated circuit is formed of relatively thin metallic films on the other side of the substrate. Shunt-mounted circuit components have been attached to such circuits by forming holes, for example, all the way through the microstrip line, the insulating substrate and the ground plane followed by soldering, for example, the circuit component to the back side of the ground plane. Conductors from the circuit component extend out of the hole and are bonded to the metallic film forming the microstrip circuitry. In other instances, the components to be attached to the integrated circuits, such for example as unpackaged diodes, have been disposed in holes formed through the insulating substrate from the side on which the microstrip transmission line is formed. The unpackaged diode is then bonded, as by soldering or welding to the ground plane in the hole so formed in the substrate. The formation of such holes is expensive and results in relatively long leads extending from the diode to one or more portions of the microstrip conductors on top of the substrate. As the frequencies in which microwave circuits are increased, for example, into the X-band, extending from 5.5 to 12 gigahertz the neutralization of, or taking into account of the reactance associated with the diode leads, becomes an increasingly significant factor. Moreover, once a component such as a diode has been bonded down into a hole in the substrate, it is virtually impossible to remove it for repair purposes without damaging the complete circuit assembly.

Accordingly, it is an object of the invention to overcome the deficiencies of the prior art.

It is a further object of the invention to provide improved apparatus and methods for mounting unpackaged diode chips on top of the substrate of a microwave integrated circuit to improve yield and repairability. Likewise, to lower the fabrication costs and to improve the circuit repeatibility. The RF insertion loss ratio between the forward and reverse bias states is also improved by the tuning of the diode chip now permitted when the chip is mounted on the top of the substrate.

The invention has the advantages of permiting the elimination of the expensive hole in the substrate and the base plate at the ground plane to which the diode chip must be soldered. It also eliminates blind chip bonding that must be accomplished down in the hole and the additional electrical parasitics present in the hole. Moreover, it permits resonating of the diode junction capacitance and the lead inductance directly at the un-packaged chip.

The technique according to the invention may be utilized with diode switches, attenuators, phase shifters, limiters and amplitude modulators, utilizing microwave integrated circuit techniques.

SUMMARY OF THE INVENTION

According to one form of the invention, a hybrid microwave integrated circuit is provided comprising: a metallic ground plane, an insulating substrate bonded at one surface to said metallic ground plane, a conducting film defining a microstrip transmission line bonded to the other surface of said substrate, a tunable film stub bonded to said-other side of said substrate and having an input end forming a gap with said transmissioner line, a microwave semiconductor chip including lead means mounted on the film side of said substrate and being connected between said microstrip transmission line and said input of said tunable stub, said lead means having a certain reactance, and the length of said tunable stub providing a reactance value such as to be tuned with the reactance of said lead means.

According to another form of the invention, in the hybrid microwave circuit described the semiconductor chip is a PIN diode.

DESCRIPTION OF THE PREFERRED EMBODIMENTS

The technique of the invention is utilized in microwave integrated circuits (MIC) to mount an unpackaged diode chip 10 on a ceramic substrate 11 which is bonded to the metallic ground plane 12 while, at the same time, the diode chip is electrically, but not mechanically, in shunt across the microstrip transmission line 13. The shunt configuration is desired in many microwave circuits such as switches, attenuators, phase shifters, limiters and amplitude modulators.

The microstrip transmission line 13 may be deposited as a film on top of the insulating substrate 11 in any well known manner. The substrate 11 may, for example, be glass or any other insulators having the desired electrical properties as is well understood. The ground plane 12 may be a thin metallic film, for example, of silver. The microstrip transmission line and the components connected to it likewise may be of silver and may be of the printed circuit variety. The circuit, as shown on the ceramic substrate 11 and ground plane 12, may be a portion of a larger circuit including more components as will be understood.

The dimensions of the microstrip transmission line 13 including its thickness as well as its width and length may be determined as is well understood in the art in order to conform to the frequencies and impedances being utilized.

Figure 1:
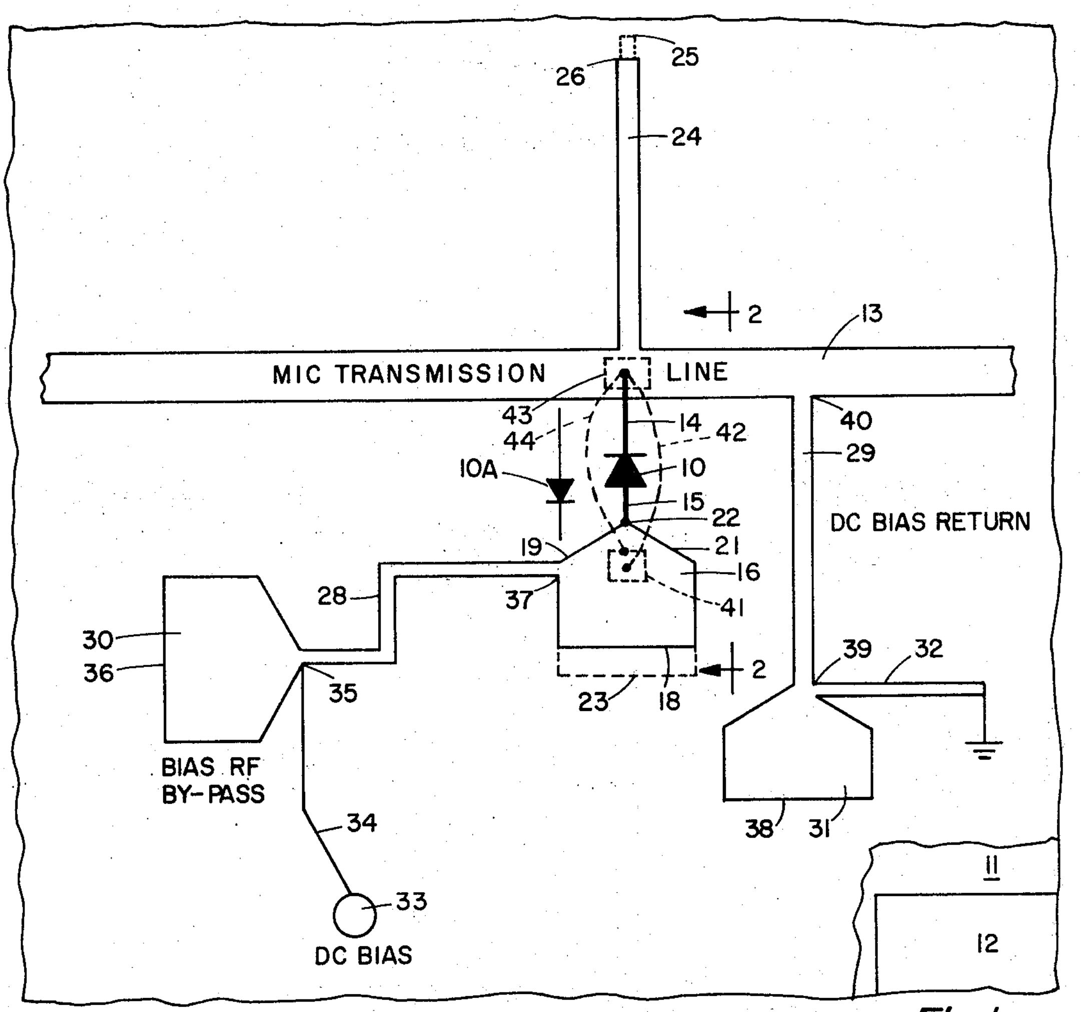
FIG. 1 is a diagrammatic representation of a microwave integrated circuit according to the invention.
Figure 2:
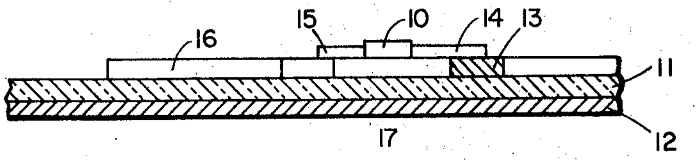
FIG. 2 is a sectional view on a larger scale taken substantially in the direction of arrows 2—2, of FIG. 1.

Considering FIG. 1 and FIG. 2 together, the unpackaged diode chip 10 is a PIN diode having beam leads 14 and 15 extending therefrom, the lead 14 being bonded to the microstrip 13 and the lead 15 being bonded to a slightly shortened one-quarter wave stub length 16. The one-quarter wave length stub 16 may be a thin film deposited on top of the ceramic substrate 11 in the same manner as the microstrip 13.

As is well understood, a PIN diode is a PN junction device wherein the P region and the N region are separated by a thin intrinsic (I) region.

Referring to FIG. 2, it will be understood that the thicknesses shown of the various members is exaggerated inasmuch as the ground plane 12 is of a very thin metallic film, the dielectric substrate 11 is a relatively thin piece and the microstrip 13 likewise is a very thin metallic film. Likewise, the beam leads 14 and 15 of the PIN diode 10, while heavy enough to support the chip, are still relatively thin and the diode itself, when intended to function in the gigahertz area, is almost microscopic in size. Thus, while there is a gap 17 shown between the diode 10 and the upper surface of the ceramic substrate 11, it will be understood that any such gap will be of the order of a few thousands of an inch.

The one-quarter wave length stub 16 may have a characteristic impedance of about 20 ohms and has its rearward edge 18 open circuited with respect to the ground plane 12. The front edge of the stub 16 has two parts 19 and 21 which are at an angle relative to the sides in order to provide decoupling with respect to the microstrip 13, it being understood that the distance from the apex 22 to the center of the microstrip 13 being very small.

The beam leads 14 and 15, while very short, nevertheless, have a small inductive reactance of the order of a few tenths of a nanohenry and it is this inductive reactance, one form of parasitic, associated with the diode chip that is tuned out by a series resonance occurring with the shortened one-quarter wave length stub 16. The stub 16 originally may have a length of precisely one-quarter wave length at the center of the frequency band intended to be used and would therefore have a length as shown by the dotted line 23. Upon determining the inductive reactance of the leads 14 and 15, the length of the one-quarter wave stub 16 may be adjusted such as by removing a portion of the metal film until the line 18 is reached. With the length adjusted to line 18 the capacitive reactance at apex 22 associated with a stub that is slightly shorter than the precise one-quarter wave length is resonated with the inductive reactance of the leads 14 and 15, as in a conventional series resonant circuit.

At the point where the lead 14 is bonded to the microstrip 13, there is a high impedance tuning stub 24 associated with the microstrip. The high impedance tuning stub is required to tune out the junction capacitance of the diode chip at reverse bias as will be discussed subsequently.

The tuning stub 24 may have a width such as to give it a characteristic impedance of about 90 ohms. The length of the tuning stub 24 is of the order of one-half wave length at the center of the frequency band being used. After the stub of about this length is deposited on the insulating substrate 11, preferably being part of the microstrip 13, the length of the stub 24 may be shortened from its original length shown by dotted line 25 to the line 26 shown solid. The length shown by the solid line 26 is slightly less than one-half wave length, thereby giving the stub 24 an inductive reactance which may be in the vicinity of 100 ohms, as is well understood.

Figure 5:
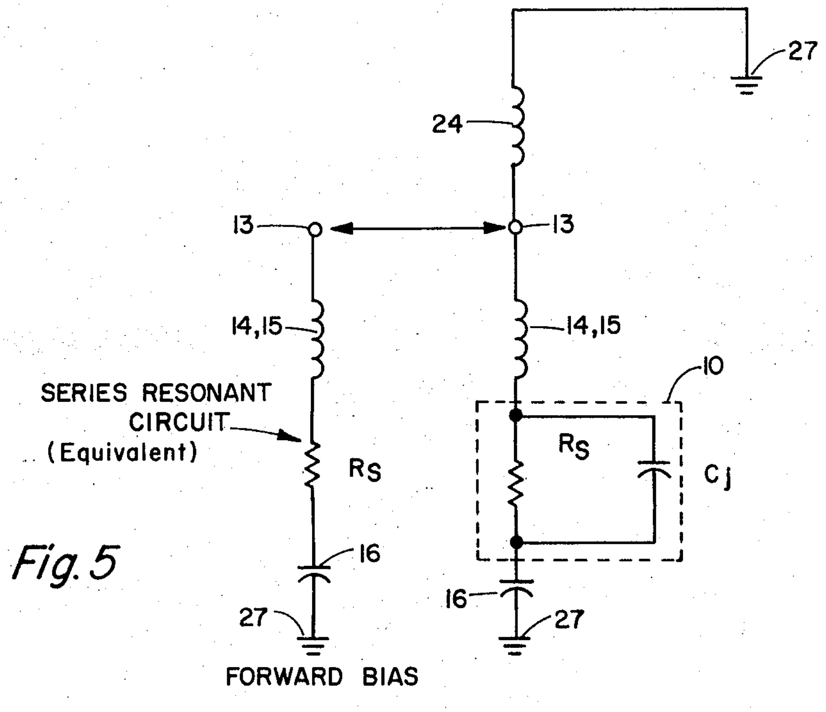
FIG. 5 is an equivalent circuit diagram illustrating operation of one aspect of the invention and FIG. 6 is an equivalent circuit diagram illustrating operation of a second aspect of the invention.

Referring to FIG. 5, there is shown the components 10, 16 and 24 of FIG. 1 in an equivalent circuit representing the forward biased diode chip in a microwave integrated circuit. In FIG. 5, the dotted rectangle 10 shows the diode chip 10 of FIG. 1, as comprising a resistance $R_s$ in parallel with a capacitor $C_j$. $C_j$ is the capacitance of junction between the P and N regions of the diode. Typically, in this case, the resistance $R_s$ might be of the order of 2 ohms and the capacitance $C_j$ of the order of 0.2 picofarads for a PIN diode. The junction capacitance $C_j$, in the forward biased condition illustrated in FIG. 5, amounts to about 100 ohms or larger reactance at X-band and thus may be neglected when considered in parallel with the 2 ohms of forward biased resistance $R_s$ in the case being considered.

The inductive reactance of the leads 14 and 15 of the PIN diode is shown as the lumped coil 14, 15. The capacitor 16 of FIG. 5 represents the capacitance of the one-quarter wave length stub 16 when shortened as already described, and when shortened in the proper amount, the capacitive reactance of capacitor 16 and the inductive reactance of the leads 14, 15 are series resonant. In effect, the net reactance is reduced to zero, and, thus the only impedance element in the equivalent circuit is the two ohms resistance of the diode. Therefore a virtual short circuit exists between the terminal 13 which represents the center of the microstrip 13 and ground 27.

The ground 27, which while not actually ground because the thin films are on top of an insulating substrate, is in effect a ground when the equivalent circuit is drawn with lumped constants as is the case in FIG. 5.

The stub 24, being slightly less than one-half wave length long, may have an inductive reactance value of about 100 ohms and is shown as being connected to ground for the same reason as explained in connection with the one-quarter wave length stub 16. The stub 24 is of no effect, essentially, under the forward bias conditions described because of the low impedance between the point 13 (transmission line) to ground through the diode 10 and the quarter wave length stub 16.

Figure 6:
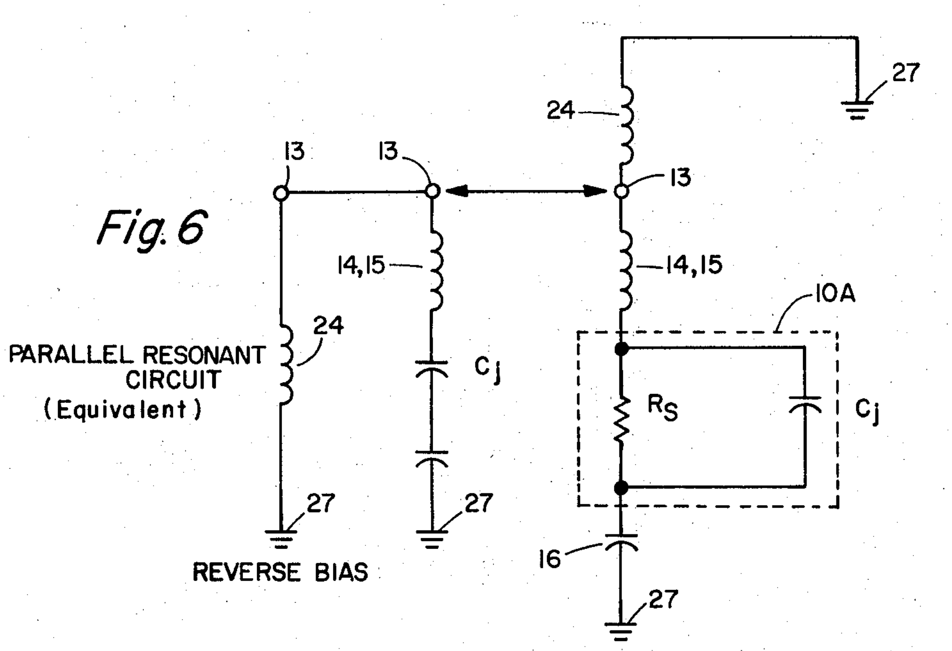

Referring to FIG. 6, the diode shown by the dotted rectangle as 10A may be the same diode shown as 10 in FIG. 5 but is now in the reverse bias condition. As will be understood, the reverse bias condition can be achieved by applying bias voltage with a different polarity to the proper terminals without otherwise changing the circuit.

In the reverse bias condition, the diode 10A has an equivalent circuit consisting of $R_s$ and $C_j$ in parallel, $R_s$ having a value of about 10,000 ohms and $C_j$ having about the same value as before namely 0.2 picofarads, or a reactive value of about 100 ohms for the particular conditions. In this case, the ohmic value of $R_s$ is large compared to the reactance of $C_j$ of 100 ohms and, therefore, the resistance $R_s$ may be neglected in the equivalent circuit shown in FIG. 6. The equivalent circuit then comprises the lumped inductance of the leads 14, 15, the lumped capacitance $C_j$ and the capacitor 16 of the shortened one-quarter wave length stub 16. In this case also, the inductive reactance of the leads 14, 15 is tuned out by the capacitive reactance of the shortened one-quarter wave length stub 16 (capacitor 16), leaving the capacitance element $C_j$ of about 100 ohms as the only effective element in this circuit.

In FIG. 6, the various grounds 27 shown are grounds for the same reasons as explained in connection with FIG. 5. In this instance, however, the inductive reactance of the stub 24 is in parallel with the capacitive reactance of $C_j$. The inductive reactance of the stub 24 being 100 ohms as is the capacitive reactance of $C_j$ results in these two elements being in a parallel resonant circuit which is to say one of high impedance or in effect, an open circuit at point 13. Thus, the effect of the capacitance of the diode 10A in the reverse bias condition is removed as an effective element in the circuit because of the high impedance it creates in combination with the inductive reactance of the stub 24. The parasitic effects in the microwave integrated circuit, as described, of the capacitance effects of the diode and the inductive effects of the leads are thus completely eliminated in a very simple and inexpensive way.

The bias circuit for diode 10, also 10A, in addition to some of the components already described, comprises the one-quarter wave length bypass stub 30 (about 20 ohms characteristic impedance), the one-quarter wave length strip 28 (about 90 ohms characteristic impedance) joining one end of the stub 30 to the forward end of the stub 16, and the DC bias return strip 29 which is one-quarter wave length long (characteristic impedance — 90 ohms) and the one-quarter wave length stub 31 (characteristic impedance 20 ohms). The strip 29 is diverted to ground (DC only) through a further strip 32, ground in this instance obtained through a thin metallic wrap brought around the edge of the substrate to the top thereof as is well understood. The bias is DC and may be applied at the terminal 33 which is connected by a very narrow line conductor 34 to the front end 35 of one-quarter wave length stub 30.

The one-quarter wave length stub 30, the one-quarter wave length 28, the one-quarter wave length strip 29, the one-quarter wave length stub 31 and the strip 32 are, of course, thin metallic films deposited by well known techniques on top of the ceramic substrate 11 as described for the other circuit components and may be made by printed circuit or other appropriate techniques.

The one-quarter wave length stub 30 is exactly one-quarter wave length long and being open circuited at its end 36, reflects as a short circuit at the point 35 where the DC bias is introduced. The strip 28 being exactly one-quarter of a wave long, therefore, reflects the short circuit at point 35 as an open circuit at point 37 where it joins the shortened one-quarter wave stub 16.

The stub 31, which is exactly one-quarter of a wave length long, is an RF open circuit at its end 38. This accordingly reflects as a short circuit at the point 39 at the front of stub 31. Consequently, there is reflected at the point 40 an open circuit and the transmission line 13 sees no RF current being diverted at the point 40.

Thus, the diode 10 may be forward or reverse biased as the case may require without altering the operation of the microwave integrated circuit components.

Figure 3:
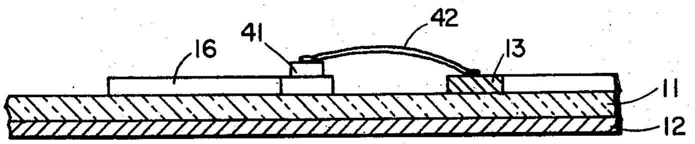
FIG. 3 is a sectional view similar to FIG. 2 of another embodiment of the invention.

Referring to FIG. 3, there is shown an arrangement similar to that described in connection with FIG. 2, but the diode comprises a unit 41 whose base may be soldered to the shortened one-quarter wave length stub 16 with a lead 42 extending over and being bonded to the center of transmission line 13. In FIG. 1, the diode chip 41 is shown dotted as is the conductor 42.

Figure 4:
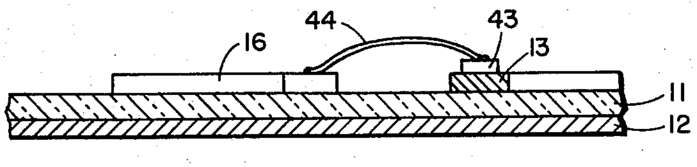
FIG. 4 is a sectional view similar to FIG. 2 of still another embodiment of the invention.

In FIG. 4, the reverse type of connection is shown wherein a diode 43 is bonded by its base to the transmission line 13 and connected by a conductor 44 to the shortened one-quarter wave length stub 16. In FIG. 1, the diode chip 43 is shown dotted as is the conductor 44.

As has been described, in summary, the basic circuit for incorporating the pseudo (electrically, but not mechanically) shunt-mounted diode chip in an MIC as illustrated in FIG. 1. A printed microstrip shortened one-quarter wave length open circuit stub (about 20 ohm characteristic impedance) is utilized to provide the RF short circuit at the back of the diode being electrically, but not mechanically, shunt-mounted. The DC bias is then brought into the back of the diode at this RF short. Low impedance stubs also provide RF shorts on the DC bias line and on the DC bias return which is across the microstrip transmission line. This approach places the transmission line at DC ground and does not require microwave blocking capacitors (contributing high loss and VSWR) at the circuit's input and output. In addition to providing topside mounting, the inventive structure permits tuning (resonating) of the diode chip's junction parameters and parasitic elements.

In the aforementioned microwave circuit applications, the diode (in particularly a PIN diode) is desired to have two bias states; normally a high-loss forward bias state and a low-loss reverse bias state.

When the diode is forward biased, whether by a DC voltage potential applied or by limiting action at a high RF power level, the junction provides a resistive (about 2 ohms) RF short to ground. This resistance is in series with the parasitic inductance of the wire lead (or leads) connecting the chip to the transmission line. To provide an ideal short circuit to ground (corresponding to maximum achievable loss) at the desired operating frequency, the inductance may be series resonated by foreshortening the 20 ohm (characteristic impedance) stub back of the diode to provide the small tuning capacitance necessary. The equivalent circuit of the series resonated diode is shown in FIG. 5.

When the diode is reverse biased (by a DC voltage potential applied) or has no bias applied, the junction provides a capacitive (about 0.2 PF) RF open circuit to ground. The diodes' reverse reactance exists alone because the parasitic lead inductance has already been tuned out by the foreshortened 20 ohm stub. To provide an ideal open circuit to ground (corresponding to minimum achievable loss) at the desired operating frequency, the capacitance may be parallel resonated by adjusting the 90 ohm stub across the equivalent diode circuit to provide the tuning inductance necessary. The equivalent circuit of the parallel resonated diode is shown in FIG. 6.

The substrate, upon which the above technique is applied, may be of any material such as alumina, ferrite or beryllia, of any dielectric constant and of any thickness. In addition to unpackaged diode chips, beam lead diodes may also be mounted and tuned using the described technique.

Manufacturers of microwave integrated circuitry requiring a shunt-mounted diode, in the past, have placed the unpackaged chip in a hole made through the substrate to the ground plane. Tuning elements cannot then be placed directly at the diode chip and much degraded RF performance is obtained.

The technique according to the invention places the unpackaged diode chip on top of the substrate instead of in a hole made through the substrate to the ground plane. Also, the new technique permits addition of printed microstrip tuning stubs directly at the diode chip, where no tuning elements could be placed in the substrate hole.

Accordingly, the invention eliminates the expensive hole in the substrate and the base plate (at the ground plane), to which the diode chip must be soldered. It also eliminates the blind chip bonding that must be accomplished down in the hole and the additional electrical parasitics present in the hole. It permits resonating of the diode's junction capacitance and lead inductance directly at the unpackaged chip.

While certain values of constants have been stated, it will be understood that this is exemplary for the particular conditions involved including the frequency of the X-band. For other conditions, other constants may be used.

While a PIN diode has been disclosed, it will be understood that other RF diodes may be used, such as Schottky barrier or hot carrier diodes. In addition, unpackaged transistor chips may be mounted, tuned and biased at microwave frequencies such as X-band using the techniques described previously.

What is claimed is:

1. A hybrid microwave integrated circuit including a microwave transmission line having a conducting film strip and a metallic ground plane and at least one microwave semiconductor device directly connected to the conducting film strip and virtually connected to the metallic ground plane instead of an actual connection to the ground plane for operation at a predetermined frequency band comprising:

said metallic ground plane, said conducting film strip, an insulating substrate bonded at one surface to said metallic ground plane and bonded at the other surface to said conducting film strip, a tunable film stub bonded to said other surface of said substrate and having an input end forming a gap with said metallic strip conductor, said microwave semiconductor device including lead means being mounted on said other side of said substrate and being connected between said conducting film strip and said input of said tunable film stub, said tunable film stub being essentially one-quarter wave length long at the center of said frequency band and having another end which is open circuited, whereby said input end and the lead of said microwave conductor device connected thereto see a short circuit and consequently see a virtual connection to said ground plane at said frequency band, said lead means having a certain reactance, and the length of said tunable stub providing a reactance value such as to be tuned with the reactance of said lead means.

2. A microwave circuit according to claim 1 wherein said microwave semiconductor device is an unpackaged diode.

3. A microwave circuit according to claim 2 wherein said semiconductor device is a PIN diode.

4. A microwave circuit according to claim 2 wherein said microwave semiconductor device is a Schottky barrier diode.

5. A microwave circuit according to claim 2 wherein said diode is operated in a forward biased direction.

6. A microwave circuit according to claim 2 wherein said diode is operated in a reverse bias direction and having a certain reactance and, a second tunable film stub bonded to said other surface of said substrate and having an input end connected to said conducting film strip adjacent the connection thereto of one lead of said microwave semiconductor diode, said second tunable film stub being essentially one-half wave length long at the center of said frequency band and having another end which is open circuited, whereby said input end of said second film stub and the lead of said diode connected thereto see an open circuit at said frequency band, and the length of said second tunable stub provides a reactance value such as to be tuned with said certain reactance of said diode.

7. The microwave integrated circuit according to claim 3 wherein said PIN diode includes beam leads.

8. The microwave integrated circuit according to claim 1 wherein the reactance of the lead means is inductive and the reactance of said tunable stub is capacitive.

9. The microwave integrated circuit according to claim 6 wherein the reactance of said diode is capacitive and the reactance of said second tunable stub is inductive.

10. The microwave integrated circuit according to claim 1 wherein the said tuning is substantially a series resonance.

11. The microwave integrated circuit according to claim 6 wherein the said tuning is substantially a parallel resonance.

12. A hybrid microwave integrated circuit including a microwave transmission line having a conducting film strip and a metallic ground plane and at least one microwave semiconductor diode directly connected to the conducting film strip and virtually connected to the ground plane instead of an actual connection to the ground plane for operation at a predetermined frequency band comprising:

said metallic ground plane, said conducting film strip, an insulating substrate bonded at one surface to said metallic ground plane and bonded at the other surface to said conducting film strip, a first tunable film stub bonded to said other surface of said substrate and having an input end forming a gap with said metallic strip conductor, said microwave semiconductor diode including lead means being mounted on said other side of said substrate, and having its lead means connected between said conducting film strip and said input of said first tunable stub, said first tunable film stub being essentially one-quarter wave length long at the center of said frequency band and having another end which is open circuited, whereby said input end and the lead of said microwave semiconductor diode connected thereto see a short circuit and consequently see a virtual connection to said metallic ground plane at said frequency band, said lead means having a certain inductive reactance, and the length of said tunable stub providing a capacitive reactance value such as to substantially series resonate with the inductive reactance of said lead means, said microwave semiconductor diode being operated in a reverse biased direction and having a certain capacitive reactance, and a second tunable film stub bonded to said other surface of said substrate and having an input end connected to said conducting film strip adjacent the connection thereto of one terminal of said microwave semiconductor diode, said second tunable film stub being essentially one-half wave length long at the center of said frequency band and having another end which is open circuited, whereby said input end of said second film stub and the lead of said microwave semiconductor diode see an open circuit at said frequency band, and the length of said second tunable stub providing an inductive reactance value such as to substantially parallel resonate with said capacitive reactance of said diode.

13. In a hybrid microwave integrated circuit including a microwave transmission line having a conducting film strip and a metallic ground plane and at least one microwave semiconductor device directly connected to the conducting film strip and virtually connected to the ground plane instead of an actual connection to the ground plane for operation at a predetermined frequency band comprising:

said metallic ground plane, said conducting film strip bonded to other surface of said substrate, an insulated substrate bonded at one surface to said metallic ground plane and bonded at the other surface to said conducting film strip, a first tunable film stub bonded to said other surface of said substrate and having an input end forming a gap with said metallic strip conductor, said microwave semiconductor device including lead means being mounted on said other side of said substrate and having its lead means connected between said conducting film strip and said input of said first tunable film stub, said first tunable film stub being essentially one-quarter wave length long at the center of said frequency band and having another end which is open circuited, whereby said input end and the lead of said microwave semiconductor diode connected thereto see a short circuit and consequently see a virtual connection to a metallic ground plane at said frequency band, said lead means having a certain value of inductive reactance, said microwave semiconductor device having a certain value of capacitive reactance, a second tunable film stub bonded to said other surface of said substrate and having an input end connected to said conducting film strip adjacent the connection thereto of the lead means of said microwave semiconductor device;

the method of tuning out the effects of the inductive reactance of said lead means which comprises shortening the length of said first tunable film stub to less than one-quarter of a wave length at said frequency band to give a capacitive reactance such as to substantially series resonate with the inductive reactance of said lead means, and thereafter shortening the length of said second tunable film stub to less than one-half of the wave length at said frequency band to give an inductive reactance such as to substantially parallel resonate with the capacitive reactance of said semiconductive device.

14. The microwave integrated circuit according to claim 12 wherein a one-quarter wave length film strip of one characteristic impedance in series with a second one-quarter wave length stub of a lesser characteristic impedance are formed on said surface of said substrate, the front end of said film strip is connected to the front end of said first tunable film stub, and the back end of said second one-quarter wave length stub is open circuited on a distributed constant basis, a DC bias input connection is provided between the junctions of said film strip and said second one-quarter wave length stub on said other surface of said substrate, and a DC bias return film is formed on said other surface of said substrate comprising a narrow one-quarter wave length strip joined to said transmission line and terminating in a third one-quarter wave length stub, the junction between said narrow strip and said third one-quarter wave length stub being grounded, and the end of said third one-quarter wave length stub being open circuited.

* * * * *